US008063483B2

(12) United States Patent
Dimitrakopoulos et al.

(10) Patent No.: US 8,063,483 B2
(45) Date of Patent: Nov. 22, 2011

(54) ON-CHIP TEMPERATURE GRADIENT MINIMIZATION USING CARBON NANOTUBE COOLING STRUCTURES WITH VARIABLE COOLING CAPACITY

(75) Inventors: Christo Dimitrios Dimitrakopoulos, Baldwin Place, NY (US); Christos John Georgiou, Scarsdale, NY (US); Alfred Grill, White Plains, NY (US); Bernice E. Rogowitz, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 713 days.

(21) Appl. No.: 11/874,861

(22) Filed: Oct. 18, 2007

(65) Prior Publication Data

US 2009/0102046 A1 Apr. 23, 2009

(51) Int. Cl.
*H01L 23/10* (2006.01)
*H01L 23/34* (2006.01)
(52) U.S. Cl. .......................... 257/712; 257/706; 257/720
(58) Field of Classification Search .................. 257/706, 257/707, 712, 717, 720, E21.001, E23.08; 977/842, 932
See application file for complete search history.

(56) References Cited

U.S. PATENT DOCUMENTS

| 5,424,054 | A | 6/1995 | Bethune et al. ............ 423/447.3 |
| 5,897,945 | A | 4/1999 | Lieber et al. .................. 428/323 |
| 6,346,189 | B1 | 2/2002 | Dai et al. ........................ 205/766 |
| RE38,223 | E | 8/2003 | Keesmann et al. ............ 313/309 |
| 6,856,016 | B2 * | 2/2005 | Searls et al. .................... 257/720 |
| 6,864,571 | B2 | 3/2005 | Arik et al. ....................... 257/712 |
| 6,887,453 | B2 | 5/2005 | Brorson et al. ............ 423/561.1 |
| 6,909,607 | B2 | 6/2005 | Radosevich et al. ........... 361/699 |
| 6,923,946 | B2 | 8/2005 | Geohegan et al. ......... 423/447.1 |
| 6,936,182 | B2 | 8/2005 | Rushford ......................... 216/85 |
| 6,936,565 | B2 | 8/2005 | Ma et al. ......................... 502/174 |
| 6,949,931 | B2 | 9/2005 | Cole et al. ....................... 324/464 |
| 6,951,001 | B2 | 9/2005 | Chen ................................... 716/5 |
| 6,955,937 | B1 | 10/2005 | Burke et al. ...................... 438/53 |
| 6,979,244 | B2 | 12/2005 | Den et al. ......................... 445/24 |
| 7,842,554 | B2 | 11/2010 | Dimitrakopoulos .......... 438/122 |
| 7,911,052 | B2 * | 3/2011 | Vadakkanmaruveedu et al. .......................... 257/715 |
| 2004/0150100 | A1 * | 8/2004 | Dubin et al. ................... 257/720 |

OTHER PUBLICATIONS

Mescia, N.C. et al. "Plant Automation in a Structured Distributed System Environment", *IBM J. Res. Develop.*, vol. 26, No. 4, Jul. 1982.

(Continued)

*Primary Examiner* — Hung Vu
(74) *Attorney, Agent, or Firm* — Robert J. Eichelburg; The Law Offices of Robert J. Eichelburg

(57) ABSTRACT

An electronic device comprises a die with at least one defined hot-spot area; and at least one defined intermediate temperature area at a temperature lower than the temperature of the hot-spot area. The device also comprises a cooling structure comprising at least one bundle of first nanotubes for cooling the hot spot area and at least one bundle of additional nanotubes for cooling the intermediate temperature area, and having heat conductivity lower than the bundle of first nanotubes. The heat conductivity of both sets of the nanotubes is sufficient to decrease any temperature gradient between the defined hot spot area, the defined intermediate temperature area, and at least one lower temperature area on the die. The walls of the first nanotubes and the additional nanotubes are surrounded by a heat conducting matrix material operatively associated with the lower temperature area.

6 Claims, 5 Drawing Sheets

OTHER PUBLICATIONS

Carre, H. et al. "Semiconductor Manufacturing Technology at IBM", *IBM J. Res. Develop.* vol. 26, No. 5, Sep. 1982.

Gao, et al., *J. Phys. Chem. B* 2000, 104, 1227-1234.

Fan, S. S. et al., "Self Oriented Regular Arrays of Carbon Nanotubes and Their Field Emission Properties," *Science*, vol. 283, pp. 512-514, (1999).

Chandra, Rajit "Automotive electronics need thermal-aware IC design" *Automotive Design Line*, (Jun. 13, 2005); http://www.automotivedesignline.com/GLOBAL/electronics/designline/shared/article/showArticle.jhtml?articled=164302553&pgno=1.

Hamann, H.F. et al. "Power Distribution Measurements of the Dual Core PowerPC™970MP Microprocessor," ISSCC Dig. Tech Papers, p. 534, Feb. 2006.

Mo, J. et al. "Integrated Nanotube Cooler for Microelectronic Applications," *Proceedings of the IEEE CPMT Conference on Electronics Components Technology (ECTC55)*, May 30-Jun. 3, 2005, Orlando, USA, pp. 51-54.

Margulis, L et al., *Journal of Microscopy* 1996, 181, 68-71.

Dimitrakopoulos, et al. U.S. Appl. No. 11/397,033, filed Mar. 29, 2006, Application as filed; Apr. 12, 2006 Information Disclosure Statement with non-patent documents; Oct. 13, 2009 Information Disclosure Statement with non-patent documents; Nov. 18, 2009 Office communication with non-patent documents; and Jan. 22, 2010 Supplemental Information Disclosure Statement with non-patent documents.

* cited by examiner

10NM

10NM

ON-CHIP TEMPERATURE GRADIENT MINIMIZATION USING CARBON NANOTUBE COOLING STRUCTURES WITH VARIABLE COOLING CAPACITY

FIELD OF THE INVENTION

The field of the invention comprises nanotube cooling members incorporated into semiconductor devices, such as very large scale integrated ("VLSI") semiconductor devices having high temperature areas or "hot-spots." The arrangement of the cooling members with other heat conductive materials minimizes or substantially eliminates thermal or temperature gradients between hot-spots and cooler areas on the device.

RELATED ART

The semiconductor industry experienced an extremely active period of innovation in the 1970's in the areas of circuit design, chip architecture, design aids, processes, tools, testing, manufacturing architecture and manufacturing discipline. The combination of these disciplines enabled the industry to enter into the VLSI era with the ability to mass-produce chips with 100,000 transistors per chip at the end of the 1980's after beginning the large scale Integration ("LSI") era in 1970 with only 1,000 transistors per chip. (Carre, H. et al. "Semiconductor Manufacturing Technology at IBM", *IBM J. RES. DEVELOP.*, VOL. 26, no. 5, September 1982). Mescia et al. also describe the industrial scale manufacture of these VLSI devices. (Mescia, N. C. et al. "Plant Automation in a Structured Distributed System Environment", IBM *J. RES. DEVELOP.*, VOL. 26, no. 4, July 1982).

There are both benefits and new challenges brought about by technology scaling to 90 nm and below. While smaller chip geometries result in higher levels of on-chip integration and performance, higher current and power densities, increased leakage currents, and low-k dielectrics with poorer heat conductivity have resulted in package and heat design challenges.

Chen, U.S. Pat. No. 6,951,001, notes that continued scaling of the complementary metal oxide semiconductor ("CMOS") fabrication process increases the number of devices on a VLSI chip but causes "within-die" variations that can become significant problems such as $L_e$ (the effective channel Length) and Vi (threshold voltage) as well as supply voltage and temperature variations. Within-die variations can also cause on-chip signal timing uncertainties. Conventional timing analysis for VLSI chips uses different values for process, voltage and temperature corners (maximum allowable combinations for these values) for maximum and minimum signal delay analysis. This approach often leads to "over designing," which may cause increasingly high power requirements and reliability problems. High power requirements can lead to overheating.

The introduction of IBM's Power6™ chip due in the middle of 2007, noted that "miniaturization has allowed chipmakers to make chips faster by cramming more transistors on a single slice of silicon, to the point where high-end processors have hundreds of millions of transistors. But the process also tends to make chips run hotter, and engineers have been trying to figure out how to keep shrinking chips down while avoiding them frying their own circuitry." (http://www.nytimes.com/reuters/technology/tech-ibm-power.html?pagewanted=print (Feb. 7, 2006))

On-die temperature variation in sub-90 nm technologies can vary as much as 50 C, or even higher in metal layers. Such severe temperature gradients can impact both the performance and reliability of the chip, as they affect signal timing, clock skew, crosstalk noise, voltage drop, and median-time-to-failure of the manufactured parts (Chandra, Rajit, "Automotive electronics need thermal-aware IC design" *Automotive Design Line*, (Jun. 13, 2005)) http://www.automotivedesignline.com/GLOBAL/electronics/design-line/shared/article/showArticle.jhtml?articled=164302553&pgno=1).

One approach for addressing the on-chip hot-spots is to employ a temperature-aware design methodology for identifying potential problem areas, and use this input during the physical design phase in the placement of the cells on the die, as advocated in Chandra, supra. While this approach may reduce some hot-spots and temperature gradients, it is unlikely that it will eliminate the problem, as, for example, a CPU core will draw more current than a DRAM memory bank. Besides, it places constraints on the chip design capability.

U.S. patent application Ser. No. 11/397,033, filed Mar. 29, 2006, describes another approach for minimizing the hot-spots which comprises growing carbon nanotubes on hot-spot areas to efficiently remove excessive heat and thereby provide an equalization mechanism to address steep on-chip temperature gradients. Nanotubes uniformly grown on the hot-spot areas, provide a cooling step function, but some temperature difference still exist around the hot-spot, since the temperature profile is more of a linear function than a step function, which we discuss later. It is desirable to further eliminate these temperature differences which would allow for greater chip design flexibility and performance tuning.

SUMMARY OF THE INVENTION

The foregoing indicates a need for a semiconductor device, such as a VLSI device, that minimizes or substantially eliminates thermal gradients in the device in order to avoid the various problems associated with these gradients, and a need for a process to make such a device. Accordingly the present invention provides such a device or devices and processes that address these needs to not only provide advantages over the related art, but also substantially obviate one or more of these and other limitations and disadvantages of semiconductor devices, particularly VLSI devices. The invention also comprises products produced by such processes and processes for minimizing temperature gradients on such devices.

The description that follows sets forth features and advantages of the invention, apparent not only from the description, but also by practicing the invention This written description, including the abstract of the disclosure and the claims and drawing as filed or as any of the foregoing may be subsequently amended will set forth additional features and advantages of the invention, and particularly point out the objectives and other advantages of the invention, showing how they may be realized and obtained.

To achieve these and other advantages, and in accordance with the purpose of the invention, as embodied and broadly described herein, the invention comprises a semiconductor device such as a VLSI device that minimizes or eliminates hot-spots and/or temperature gradients in the device, by using heat conductor means comprising a plurality of arrays or bundles of nanotube means positioned on the device to conduct heat away from such hot-spots. In one embodiment, we position the plurality of arrays or bundles of nanotube means on the die surface of the VLSI device. At least one of the arrays or bundles comprises nanotube means having heat conductivity properties greater than the heat conductivity properties of at least one other of the nanotube arrays or bundles. We position the nanotube means such that the nanotube arrays or bundles having the highest heat conductivity are operatively associated with and in heat conducting relationship with hot-spot areas having high temperatures and those nanotube arrays or bundles having relatively lower heat conductivity properties that are operatively associated with and in heat conducting relationship with intermediate temperature areas, i.e., areas having a temperature intermediate the hot spot areas and a relatively lower temperature area. This relatively lower temperature area comprises the area of the die at the minimum temperature range of the device when it is operating.

The terms "temperature gradient" and "thermal gradient" mean the difference in temperature between the hot-spot and another area or areas on the semiconductor device having a lower temperature. The use of such nanotubes takes advantage of their extremely high heat conduction capability along their long axis compared to the metals currently used to remove heat from these devices, and the positioning of the arrays or bundles in the foregoing manner minimizes or eliminates on-chip temperature gradients These advantages are achieved by growing such nanotube arrays or bundles selectively on the hot-spot areas while using conventional heat conductors for some of the relatively cooler areas of the chip.

Non-selective growth on the device, i.e., covering the entire surface of the device with nanotube arrays or bundles would have little or no effect in eliminating or minimizing hot-spots or thermal gradients on the device since the rate and degree of cooling the entire surface would be substantially the same, so that the hotter areas would still remain relatively hotter and the other areas relatively cooler even though the temperatures of both would be reduced. Selective placement of the nanotube arrays or bundles on the device in combination with placement of conventional heat conductors in complementary areas of the device comprises a key element in obtaining the advantages of the invention.

Accordingly, this invention relates in general to techniques aimed at providing selective cooling on VLSI chips with high topological resolution, in order to eliminate on-chip hot-spots and severe temperature gradients and improve the chip electrical performance and reliability. The absence of hot-spots and temperature gradients will enable tighter specs (e.g., higher clock rates, threshold voltages, etc.) in the chip design. U.S. patent application Ser. No. 11/397,033, filed Mar. 29, 2006, "VLSI Hot-Spot Minimization Using Nanotubes" shows how to use nanotubes over hotspot areas and Cu or other heat conductors over cooler areas in order to substantially eliminate or substantially minimize temperature gradient on a chip; however, the abrupt border between the nanotube covered area and the other heat conductor covered area and the resulting abrupt change in heat conductivities of the two areas does not match the more gradual T-gradient ("temperature gradient") profile that is usually encountered on Si chips. In this invention we propose ways to eliminate the T-gradient profile that is usually encountered on Si chips by better matching those temperature gradients with appropriate gradients of heat conductivity. Manufacturing complexity and processing cost will dictate how accurate the temperature and heat conductivity gradients will match. We propose ways to fabricate carbon nanotube cooling structures with variable cooling capability over different areas on a Si die or comparable semiconductor devices by adjusting parameters such as the nanotube diameter, spacing or packing density (i.e., the distance between the nanotubes on the surface of the device, which we also define as the arial density) and other parameters that determine the fill factor of a nanotube array or bundle with graphene sheets. We subsequently define fill factor.

In one embodiment we provide a semiconductive device comprising a die wherein the die comprises:

(a) at least one defined hot-spot area lying in a plane on the die;

(b) at least one defined minimum temperature area comprising an area lying in a plane on the die and at a temperature lower than the temperature of the hot-spot area, wherein the minimum temperature area comprises the minimum temperature of the die;

(c) at least one defined intermediate temperature area comprising an area lying in a plane on the die at a temperature intermediate the temperature of the hot-spot area and the minimum temperature area;

(d) cooling means comprising at least one bundle of first nanotube means composed of a heat conducting material and extending in a direction outwardly from the plane of the hot-spot area, the first nanotube means being operatively associated with and in heat conducting relationship with the hot-spot area and having heat conductivity sufficient to decrease any temperature gradient between the hot-spot area and any other temperature areas on the die;

(e) cooling means comprising at least one bundle of additional nanotube means composed of a heat conducting material and extending in a direction outwardly from the plane of the intermediate temperature area, the additional nanotube means being operatively associated with and in heat conducting relationship with the intermediate temperature area and having heat conductivity sufficient to decrease any temperature gradient between the the intermediate temperature area and any other temperature areas on the die;

(f) the heat conductivity of the bundle of first nanotube means being greater than the heat conductivity of the additional nanotube means;

(g) the bundle of first nanotube means and the bundle of additional nanotube means being substantially surrounded by a matrix material comprised of a heat conducting material operatively associated with and in heat conducting relation with the minimum temperature area;

(h) the heat conductivity of the bundle of first nanotube means and the bundle of additional nanotube means being greater than the heat conductivity of the matrix material;

(i) the distal ends of the bundle of first nanotube means and the bundle of additional nanotube means being positioned for direct contact with a medium comprising a heat exchange medium.

This invention presents an approach to smoothen sharp temperature gradient contours resulting from hot-spots on semiconductor devices such as a VLSI die, by using nanotube arrays or bundles of varying heat capacity, e.g. nanotubes of different diameters or nanotube arrays or bundles with different spacing or packing of the nanotubes relative to one another (i.e., spacing or packing density or "density" which is the number of nanotube structures per unit of area of the device, which we also describe as the arial density) that matches the temperature profile of the device. This invention is based on the extremely high heat conduction capability of nanotubes along their long axis, which is much higher than that of metals which are currently being used.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

BRIEF DESCRIPTION OF THE DRAWINGS

The accompanying drawings, incorporated in and which constitutes a part of this specification, illustrates single and multiple embodiments of the invention, and together with the other parts of the specification, serves to explain the objects, advantages and principles of the invention.

FIG. 8 in this regard shows reduction of the temperature in a stepwise manner, each step corresponding to an additional area of nanotube cooling means, with a different heat conductivity than the previous one.

FIG. 9 also illustrates the results of adding self-assembled monolayer (SAM) caps on the catalyst nanoparticles where the SAM molecules have different alkyl chain lengths. This provides control of the NNN catalyst nanoparticle distance. These SAM caps are burned off before CNT growth.

DETAILED DESCRIPTION OF THE INVENTION

Figure 1:
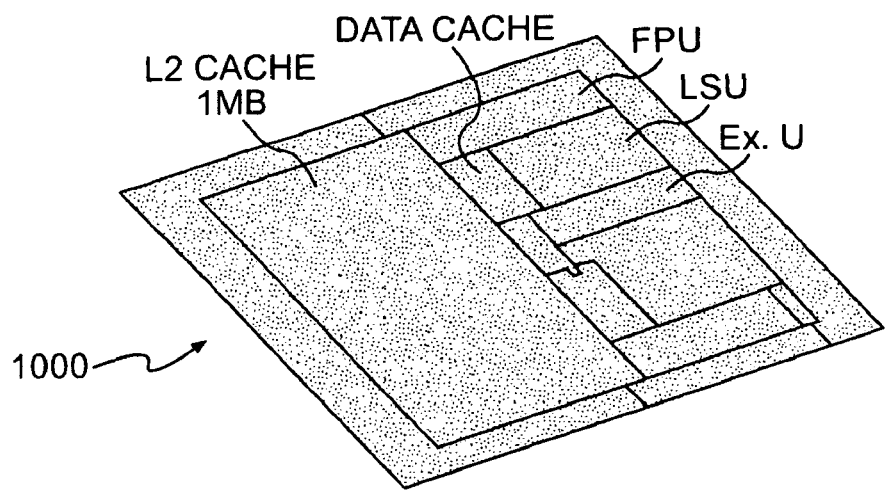
FIG. 1 comprises a device 1000 and illustrates on-die hot spots as revealed by IR imaging. Lighter shaded areas correspond to higher temperature. The fine patterns of the processor features are evident (Hamann, H. F. et al. "Power Distribution Measurements of the Dual Core PowerPC™970MP Microprocessor," ISSCC Dig. Tech Papers, p. 534, February 2006).

The present invention comprises an electronic device such as a semiconductive device comprising a die wherein the die comprises:
(a) at least one defined hot-spot area lying in a plane on the die;
(b) at least one defined minimum temperature area comprising an area lying in a plane on the die and at a temperature lower than the temperature of the hot-spot area, wherein the minimum temperature area comprises the minimum temperature of the die;
(c) at least one defined intermediate temperature area comprising an area lying in a plane on the die at a temperature lower than the temperature of the hot-spot area;
(d) cooling means comprising at least one bundle of first nanotube means composed of a heat conducting material and extending in a direction outwardly from the plane of the hot-spot area, the first nanotube means being operatively associated with and in heat conducting relationship with the hot-spot area and having heat conductivity sufficient to decrease any temperature gradient between the hot-spot area and any other temperature areas on the die;
(e) cooling means comprising at least one bundle of additional nanotube means composed of a heat conducting material and extending in a direction outwardly from the plane of the intermediate temperature area, the additional nanotube means being operatively associated with and in heat conducting relationship with the intermediate temperature area and having heat conductivity sufficient to decrease any temperature gradient between the intermediate temperature area and any other temperature areas on the die;
(f) the heat conductivity of the bundle of first nanotube means being greater than the heat conductivity of the additional nanotube means;
(g) the bundle of first nanotube means and the bundle of additional nanotube means being substantially surrounded by a matrix material comprised of a heat conducting material operatively associated with and in heat conducting relation with the minimum temperature area;
(h) the heat conductivity of the bundle of first nanotube means and the bundle of additional nanotube means being greater than the heat conductivity of the matrix material;

(i) the distal ends of the bundle of first nanotube means and the bundle of additional nanotube means being positioned for direct contact with a medium comprising a heat exchange medium.

The bundle of first nanotube means and the bundle of additional nanotube means have different arial densities on the device wherein the nanotube means having the higher arial density on the device cools the device at a rate higher than the nanotube means with the lower arial density on the device.

The invention also comprises a process for providing cooling means on the surface of a semiconducting device having a die comprising:

(a) defining by thermal analysis, at least one hot-spot area (a) lying in a plane on the die;

(b) defining by thermal analysis, at least one minimum temperature area (b) comprising a defined area lying in a plane on the die and at a temperature lower than the temperature of the defined hot-spot area, wherein the minimum temperature area comprises the minimum temperature of the die;

(c) defining by thermal analysis, at least one intermediate temperature area (c) comprising an area lying in a plane on the die at a temperature lower than the temperature of the defined hot-spot area;

(d) fabricating a mask (d) corresponding to the hot-spot area (a);

(e) selectively applying to the surface of the die by means of the mask (d), a catalyst to define a catalyst area (e) corresponding to the hot-spot area (a) and thereby produce a semiconductor device having a die with a selectively catalyzed surface (e) corresponding to hot-spot area (a); the catalyst selected to promote the growth of a bundle of heat conducting first nanotube means;

(f) fabricating a mask (f) corresponding to the intermediate temperature area (c);

(g) selectively applying to the surface of the die by means of the mask (f) a second catalyst to define a catalyst area (g) corresponding to the intermediate temperature area (c) and there produce a semiconductor device having a die with a selectively catalyzed surface (g) corresponding to intermediate temperature area (c); the second catalyst selected to promote growth of a bundle of heat conducting additional nanotube means;

(h) growing first nanotube means (h) from a heat conducting material and on the selectively catalyzed surface (e) corresponding to the hot-spot area (a) and to extend in a direction outwardly form the plane of the hot-spot area (a) the first nanotube means (h) being operatively associated with and in a heat conducting relationship with the hot-spot area (a) to decrease any temperature gradient between the hot-spot area (a) and other areas on the device;

(i) growing additional nanotube means (i) from a heat conducting material and on the selectively catalyzed surface area (g) corresponding to the intermediate temperature area (c) to extend outwardly from the plane of the intermediate temperature area (c), the additional nanotube means (i) being operatively associated with and in a heat conducting relationship with the intermediate temperature area (c) to decrease any temperature gradient between the intermediate temperature area (c) and other areas on the device;

(j) depositing a heat conducting matrix material (j) on the minimum temperature area (b), to form a matrix to surround the first nanotube means and the additional nanotube means, the heat conducting matrix material (j) extending to and operatively associated with the area (b) to conduct heat away from the area (b), (k) the first nanotube means (h) and the additional nanotube means (i) made from heat conducting materials having a higher heat conductivity than the heat conducting matrix material, the heat conductivity of the first nanotube means (h) being greater than the heat conductivity of the additional nanotube means (i);

(l) providing for the distal ends of the first nanotube means and the additional nanotube means to be sufficiently exposed above the heat conducting matrix material (j) to make the distal ends available for direct contact with a medium comprising a heat exchange medium.

The present invention also includes the foregoing semiconductor processes and articles of manufacture comprising two or more hot spots surrounded by one or more areas of intermediate temperature and one or more areas of the lowest temperature range on the die.

The "direction" of the nanotubes can be substantially perpendicular to the plane of the hot-spot or the plane of the intermediate area, i.e. at substantially a 90° angle, to the plane of the hot-spot or the plane of the intermediate area, or at an angle to the plane of the hot-spot or the plane of the intermediate area, e.g., anywhere from about 70° to about 90°, or about 80° to about 90° to the plane of the hot-spot or the plane of the intermediate area. The related art shows in this respect that the principal orientation of the nanotubes may not only be straight walled but also include configurations where the wall bends at its upper reaches or may branch, or may take on other configurations. The nanotubes also comprise self oriented (straight up and down) structures with the individual nanotubes being substantially parallel to one another.

Figure 2:
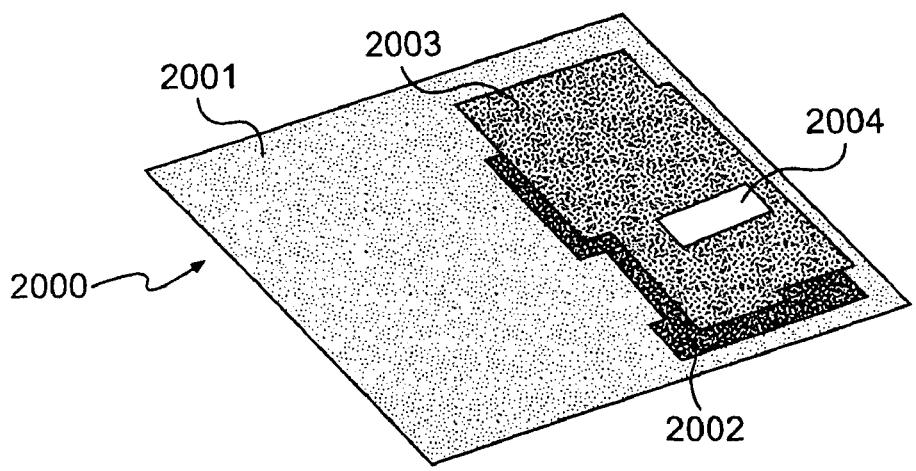
FIG. 2 comprises an illustration of a lithographic mask 2000 with the black area 2001 corresponding to the cooler areas on the chip die of FIG. 1, and areas 2002, 2003, and 2004 are areas of increasing heat generation with increasing cooling needs.
Figure 6:
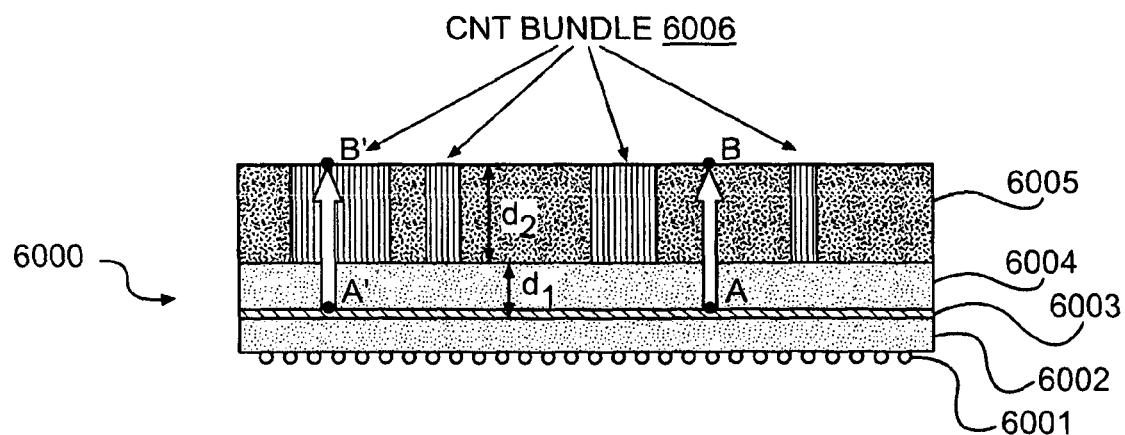
FIG. 6. comprises a side elevation in cross section of a semiconductor device comprising carbon nanotube bundles arrayed in a predetermined pattern, imposed by a catalyst layer pattern (Fan, S. S. et al., "Self Oriented Regular Arrays of Carbon Nanotubes and Their Field Emission Properties," Science, Vol. 283, pp. 512-14, (1999)) The CNTs are oriented substantially perpendicular to the substrate. The CNT arrays or bundles are grown on this pattern over potential hot-spot areas on the chip, determined by a heat analysis of the surface of the chip. We use this analysis to form the pattern as a lithographic mask (as in FIG. 2). The chip area is covered with copper which we chemical-mechanical-polish (CMP) down to the top of the CNTs. We also use this figure in the mathematical computation of the thermal properties of the device.

In one embodiment, the nanotube means comprise carbon nanotubes ("CNT's"), described by Fan, S. S. et al., in "Self Oriented Regular Arrays of Carbon Nanotubes and Their Field Emission Properties," *Science*, Vol. 283, pp. 512-14, (1999) which illustrates configurations of individual nanotubes substantially parallel to one another. The nanotubes may also comprise off-vertical arrays or bundles or dendritic or forest arrays or bundles (Fan et al. FIG. 6), as well as fin projections, or porous two-dimensional arrays or bundles, or porous structures as disclosed in FIGS. 2, 4, and 6 of Mo, J. et al. "Integrated Nanotube Cooler for Microelectronic Applications," *Proceedings of the IEEE CPMT Conference on Electronics Components Technology* (ECTC55), May 30-Jun. 3, 2005, Orlando, USA, pp. 51-54, and may include bending, and/or intertwining deviations from generally aligned and straight nanotubes as described by Arik et al. U.S. Pat. No. 6,864,57. The present invention includes all of the foregoing configurations.

The invention comprises a plurality of these nanotubes, i.e., bundles somewhere from substantially tens, to hundreds, to thousands, to tens of thousands, or hundreds of thousands or more as distinguished from structures having only 1, or 2 or 3 extending from the surface as disclosed by Dai et al., U.S. Pat. No. 6,346,189 or Den et al. U.S. Pat. No. 6,979,244.

Bethume et al., U.S. Pat. No. 5,424,054, describe hollow carbon fibers or nanotubes having a cylindrical wall comprising a single layer of carbon atoms and a process for producing such fibers. Other references disclose the production of nanotubes, including Geohegan et al. U.S. Pat. No. 6,923,946; Ma et al. U.S. Pat. No. 6,936,565; Arik et al. U.S. Pat. No. 6,864,571; Dai et al., U.S. Pat. No. 6,346,189; Keesman et al., U.S. Pat. No. RE38,223; Brorson, et al., U.S. Pat. No. 6,887,453; Mo, J. et al. "Integrated Nanotube Cooler for Microelectronic Applications," *Proceedings of the IEEE CPMT Conference on Electronics Components Technology* (ECTC55), May 30-Jun. 3, 2005, Orlando, USA, pp. 51-54; Berber, S. et al. "Unusually High Thermal Conductivity of Carbon Nanotubes," *Physical Review Letter*, vol. 84, No. 20, pp. 4613-16, 2000; Fan, S. S. et al., "Self Oriented Regular Arrays of Carbon Nanotubes and Their Field Emission Properties," *Science*, Vol. 283, pp. 512-14, (1999); Ma et al., U.S. Pat. No. 6,936,565; Den et al. U.S. Pat. No. 6,979,244; *Brave New Nanoworld*, p. 3, http://www.ornl.gov/info/ornlreview/rev32_3/brave.htm (Oak Ridge National Laboratory); whereas Den et al.; and *Brave New Nanoworld* (supra) describe methods for making multiwall nanotubes of carbon. Iijima, S., *Nature* 1991, 354, 56; Ajayan, P. M., et al. *Nature* 1992, 358, 23; Ebbesen, T. W., *Nature* 1992, 358, 20; Gao, et al., *J. Phys. Chem. B* 2000, 104, 1227-1234; also describe methods for making nanotubes and Margulis, L. et al., *Journal of Microscopy* 1996, 181, 68-71 identifies helical nanotubes. All of the foregoing references teach nanotubes falling within the scope of the invention.

The nanotubes may also comprise helical structures, sometimes referred to as nanosprings or zig-zag structures and are of special interest since they have greater surface area per unit length, whether extended or unextended, as compared to nanotubes that extend substantially in a non-helical or non zig-zag manner. The extra surface area per unit length not only of nanosprings, but also dendritic or forest arrays or bundles, fin projections, and porous two-dimensional arrays or bundles, or porous structures, all of which fall within the scope of the invention, present configurations that will impact on the convective or conductive cooling properties of the nanotubes.

Den et al. U.S. Pat. No. 6,979,244 describe an arc discharge process for manufacturing these helical carbon nanotubes having an inner diameter of about 4 to about 34 nm and about 1 μm in length as well as a multilayer helix having an inner diameter of about 0.34 nm produced by an arc discharge process. Laser evaporation produces a "rope" shaped carbon nanotube. Gao, et al., *J. Phys. Chem. B* 2000, 104, 1227-1234 also describes these so-called nanotube zig-zag and helical structures and gives methods for manufacturing them. Arik et al. U.S. Pat. No. 6,864,571 discloses these helical structures, referring to them as "nanosprings." Ma et al. U.S. Pat. No. 6,936,565 describes a process for manufacturing these nanosprings, as well as nanotubes comprising physical vapor deposition such as glancing angle deposition or "GLAD."

These nanotubes comprise single wall or multiwall structures up to several centimeters in length as described by Brorson, et al., U.S. Pat. No. 6,887,453 and can have up to about 8 to about 10 or more carbon layers. Den et al. U.S. Pat. No. 6,979,244 also describes these multiwall carbon nanotube structures up to about 1 μm in length, either single wall or multiwall, and in some instances surrounded by amorphous carbon, as well as methods for their manufacture, e.g., by arc discharge, laser evaporation, pyrolysis and plasmas.

Keesman et al., U.S. Pat. No. RE38, 223; Ajayan and Iijima, *Nature*, 361, p. 333: Geohegan, U.S. Pat. No. 6,923, 946; Arik et al. U.S. Pat. No. 6,864,571; Lieber et al. U.S. Pat. No. 5,897,945; Ma et al. U.S. Pat. No. 6,936,565; and Margulis, L. et al., *Journal of Microscopy* 1996, 181, 68-71 describe variations of these nanotube structures all of which fall within the scope of the invention.

Production of these nanotube means employs processes known in the art, such as the processes described in the foregoing and following references and come within the scope of this invention. The manufacture of carbon nanotube means employs catalysts for the pyrolysis of a carbon containing material, such as for example ethylene or other organic compounds in the presence of a catalyst such as Ni or Co. Den et al. U.S. Pat. No. 6,979,244, citing WO 89/07163 mentions Fe optionally with Mo, Cr, Ce or Mn as suitable catalysts, whereas Dai et al., U.S. Pat. No. 6,346,189 discloses the use of Fe, Mo, Ru Mo, Co, Ni, Zn, or Ru and preferably the oxides of Fe, Mo, Ru, and Zn, e.g., $Fe_2O_3$ having a particle size of from about 1 μm to about 5 μm as catalysts. Geohegan et al. U.S. Pat. No. 6,923,946 describe Fe, Ni, Co, Rh, Pd or alloys thereof as catalysts, and Mo, J. et al. "Integrated Nanotube Cooler for Microelectronic Applications," *Proceedings of the IEEE CPMT Conference on Electronics Components Technology* (*ECTC*55), May 30-Jun. 3, 2005, Orlando, USA, pp. 51-54 employ Fe, Ni, and Co for the catalytic conversion of carbon materials into these nanotubes.

The cooling means comprising the nanotube means is operatively associated with the hot-spot area to decrease any temperature gradient between the hot-spot area and at least one other area on the die defined by a temperature lower than the hot-spot area, which is an area set out by thermal analysis that has a temperature lower than the hot-spot area or areas. These gradients may comprise temperature differences anywhere from about 19° C. to about 45° C., or about 50° C. to about 80° C., or about 25° C. to about 100° C.

"Operatively associated with" also includes those instances where the hot-spot is beneath another layer or layers on the die or enveloped by a packaging material so that heat from the hot-spot is presented to the exterior surface of the other layer or layers or packaging material. The cooling means in that case will be placed on this heated exterior in substantially the same way as they are placed on the hot-spot on the die area.

In one embodiment an adhesion layer secures the catalyst for forming the nanotubes, and as a result the nanotubes as well to the surface of the die. This adhesion layer also helps to join the matrix material to the die. The adhesion layer comprises a boron material or silicon material or metal material, the boron material and the silicon material comprising elemental boron and silicon or compounds of boron and silicon respectively, whereas the metal material comprises elemental metals as well as metal compounds and alloys and combinations of a boron material or silicon material or metal material.

Examples of adhesion layers comprise Cr or Ta or Ti layers. Fan, S. S. et al., "Self Oriented Regular Arrays of Carbon Nanotubes and Their Field Emission Properties," *Science*, Vol. 283, pp. 512-14, (1999), however, describe growing these nanotubes directly on a silicon surface without employing an adhesion layer, this process also falling within the scope of one aspect of the invention.

These nanotube cooling means of the invention are substantially surrounded by, and in one embodiment, are substantially contiguous with a matrix material on the surface of the device, such as the surface of the die. "Substantially contiguous" in this context means touching the matrix at any point or touching the matrix at a plurality of points, or along the full length of the nanotube means. The matrix comprises a second heat conducting material and is operatively associated with and in a heat conducting relation with the other area on the die defined by a temperature lower than the hot-spot area.

"Operatively associated with" in this context means the matrix material is contiguous at several points or through the whole area of the matrix on the other area of the device such as the die defined by a temperature lower than the hot-spot area, device layers above this area, or packaging material enveloping the device, directly or through an adhesion layer or such layers on such other area on the device, where the adhesion layer comprises a metal material, or boron material, or silicon material, or device components or packaging material that envelops the die. "Metal material" in this context includes elemental metal or metals, metal alloys or metal compounds such as oxides, nitrides, carbides and the like, and "silicon material," and "boron material" have the same meaning as previously given.

The matrix material comprises a layer of a heat conducting material which in some instances comprises a material that is relatively thick, e.g., anywhere from about 1 μm to about 20 μm, or about 20 μm to about 200 μm, or about 100 μm to about 10000 μm thick, and comprises not only Cu, but also Zr, Nb, Ta, Mo, Zn or Al, and combinations thereof, i.e., alloys thereof with one another or other elements. Den et al. U.S. Pat. No. 6,979,244 also describes these elements as conductive layers in semiconductor devices. Other materials with lower heat conductivity than copper can also be used in cases where the temperature gradients are too large for the matrix/carbon nanotube combinations to eliminate or minimize temperature gradients as described above. Such materials may comprise, but are not limited to, metal oxides or nitrides, silicon or boron nitrides, and organosilicate glasses.

The heat conductivity of the nanotube materials (i.e., the material from which the nanotube means are formed) is greater than the heat conductivity of the material from which the matrix is made. In another aspect of the invention, the distal ends of the nanotubes are substantially free of the matrix material or other material, i.e., the distal ends of the nanotube means are provided with a surface available for direct contact with a medium comprising a cooling medium such as a cooling fluid, i.e., a gas or a liquid, or other cooling medium such as a paste containing aluminum powder and/or flake.

In some instance matrix material might project over the distal ends and requires employing a process to substantially remove the projecting matrix to expose the distal ends. We can employ, e.g., a chemical-mechanical polishing (CMP) process in this regard. In other instances providing a mask over the distal ends during manufacture of the device to substantially prevent other materials from attaching to the surface of the distal ends can have the same effect. Removal of this mask upon the completion of the manufacturing process will make the surface of the distal ends available for direct contact with a medium comprising a heat exchange medium such as a heat exchange fluid. This makes the distal ends of the nanotube means available for direct contact with a medium comprising a heat exchange medium.

In another embodiment, the device may be characterized not only by any one of the foregoing features, but also any combination of these features.

Accordingly, the main thrust of this invention is to generate a specific pattern of nanotube that corresponds to the underlined hot-spot pattern of the chip, and where the graphene sheet fill factor varies in a discontinuous, step-wise manner along the temperature gradient.

We define fill factor in terms of heat conductivity of an oriented bundle of carbon nanotubes along the common direction of the CNT axes. It is proportional to the percentage of the bundle cross sectional area occupied by graphene sheets (defined as the graphene sheet fill factor), and inversely proportional to the remaining percentage of free space within the bundle. CNTs can be single wall and multiwall.

Figure 8:
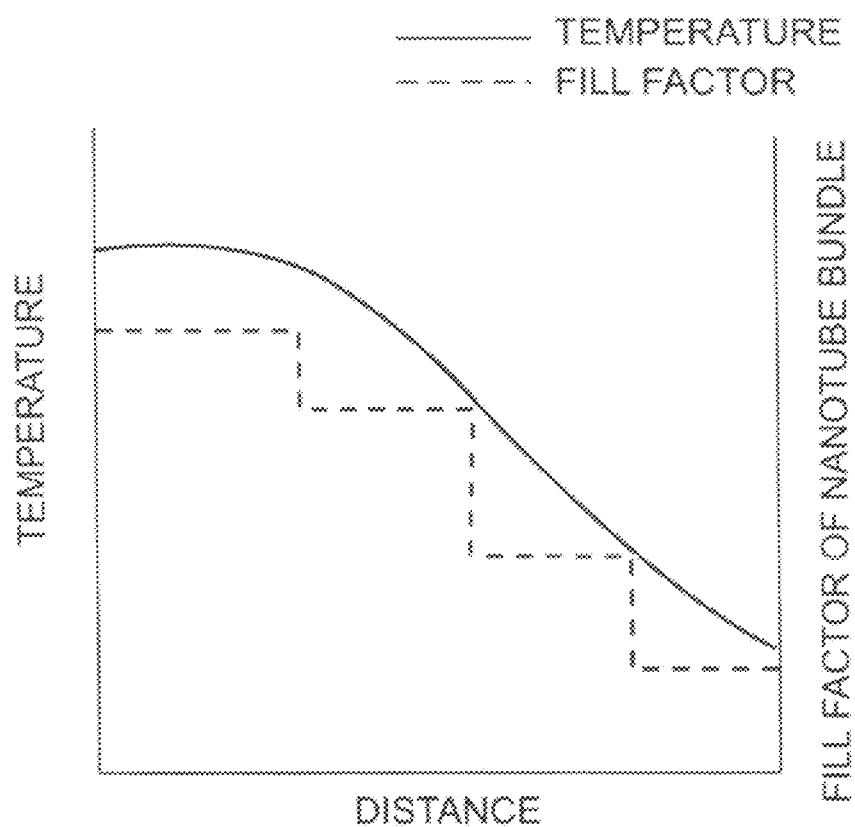
FIG. 8 comprises a graph plotting temperature as one ordinate and fill factor as a second ordinate against distance as the abscissa to indicate a path from a hot-spot to the coolest area on a semiconductor device of the invention.

As we follow a path from the hot-spot to the coolest area, the step factor is reduced in a stepwise manner, each step corresponding to an additional area of nanotube cooling means, with a different heat conductivity than the previous one. We show this in FIG. 8. In one embodiment single wall nanotube bundles with larger diameter that the nanotubes of another nanotube bundle (and, hence, lower fill factor and lower heat conductivity than the latter) are used to match the temperature gradient starting at the hot spot and ending at the die area with the minimum temperature.

Figure 4:
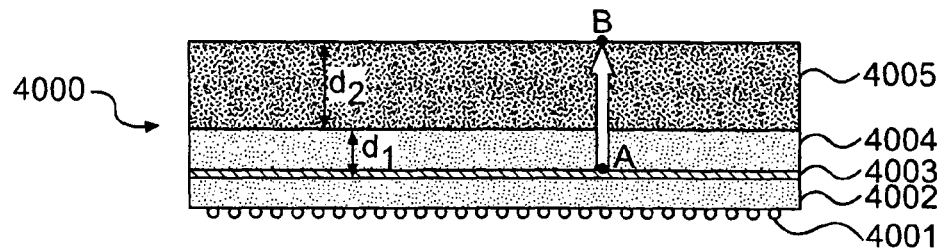
FIG. 4 comprises a side elevation in cross section of a semiconductor device comprising a Si wafer backed in some parts of its surface by a Cu layer (not shown) and in some other areas by a CNT layer (not shown) of the same thickness as the Cu layer. We also use this figure in the mathematical computation of the thermal properties of the device.

As it is well-known in the art, CNTs have the highest thermal conductivity of any material (6000 W/mK vs. 400 for copper) Berber, S., Kwon, Y.-K., and Tomanek, D "Unusually High Thermal Conductivity of Carbon Nanotubes," *Physical Review Letter*, vol. 84, No. 20, pp. 4613-4616, 2000; Srivastava, N. and Banerjee, K, *Proceedings of the 21$^{st}$ International VLSI Multilevel Interconnect Conference* (VMIC) (2004)). After we place the CNT pattern on the substrate we deposit a thick copper layer over the whole die area and CMP to just above the CNT tops (FIG. 4). Heat removal through the nanotube bundle is much faster than heat removal through areas that are covered only with copper thus reducing or completely eliminating hot-spot areas and temperature gradients across the chip. This is done on the Si side of the chip in one embodiment. But the process of the invention and the resultant article of manufacture also include cooling from the other side (BEOL or the interconnect side too).

Cooling will take place at the Si side of the chip. We deposit the CNTs by plain CVD at T>800 C, before processing begins but take steps to ensure process compatibility with all subsequent steps. Alternatively, we grow CNTs by plasma enhanced chemical vapor deposition ("PECVD") later or at the end of all processing, but we do not limit ourselves only to this process. We also eliminate or substantially eliminate gradient temperatures in the device at both sides of the device by use of CNTs and the other methods of our invention described herein. By "both sides" we mean the BEOL side and the opposite side of the wafer, i.e., the side of the silicon die without circuit components on it Then we deposit a thick copper layer over the whole die area and CMP to just above the CNT tops (FIG. 4). Heat removal through the nanotube bundle is faster than heat removal through areas that are covered only with copper of equivalent thickness, thus reducing or completely eliminating hot-spot areas and temperature gradients across the chip.

A nanotube can be visualized as a graphene sheet (a one-layer sheet comprising C atoms arranged in a planar hexagonal pattern) that has been seamlessly rolled into the shape of a cylinder Related references similarly consider nanotubes as strips of graphite sheet rolled into tubes a few nanometers in diameter and up to hundreds of micrometers (microns or "μm") in length, such as those disclosed by Den et al. U.S. Pat. No. 6,979,244 which describe them as sheets of carbon hexagonal meshes parallel to and extending 360° around a vertical axis producing a graphite network of hexagonal rings having the highest heat conductivity of any material.

The heat conductivity is highest parallel to the long cylinder axis, along its carbon based wall. As previously noted, the heat conductivity of an oriented bundle of carbon nanotubes along the common direction of the CNT axes is proportional to the percentage of the bundle cross sectional area occupied by graphene sheets (defined as the graphene sheet fill factor), and inversely proportional to the remaining percentage of free space within the bundle. CNTs can be single wall and multiwall. The graphene sheet fill factor includes nanotubes with anywhere from 1 to about 10 or more wall nanotube structures, as described, e.g., by Brorson et al. supra. The latter can be visualized as comprising a number of concentric cylinders with a common long axis of symmetry and slightly different diameters. Multiwall carbon nanotubes ("MW-CNTs") are an efficient way to maximize fill factor of a CNT bundle. Fill factor is also maximized by close packing CNTs in a hexagonal close packed ("HCP") configuration. Fill factor of a HCP CNT bundle comprising CNTs of the same diameter is inversely proportional to the CNT diameter. Thus heat conductivity is proportional to the fill factor and can be controlled in several ways as discussed above.

Controlled variation of the CNT diameter can be achieved by varying the diameter of catalyst nanoparticles used for CNT growth. It has been observed that the CNT diameter is tightly related to the diameter of the catalyst nanoparticles used (Lieber et al. *J. Phys. Chem.* B 2002, 106, 2429-2433). Lieber et al. showed that catalyst nanoparticles with average diameters of 3, 9, and 13 nm were used to grow carbon nanotubes with average diameters of 3, 7, and 12 nm, respectively. In these experiments the diameter size distribution of the catalyst nanoparticles was quite narrow, which translated to the size distribution of the CVD grown CNT, at least as far as the former two diameter sizes are concerned. Other CVD growth parameters (e.g. supply of C in the CVD chamber, the kind of C containing molecule used and growth T as discussed by Lieber et al. supra.) also have an affect on the diameter of the nanotubes. Accordingly, the diameter of the nanotubes of the invention may vary anywhere from about 1 to about 25 nm or more.

Catalyst nanoparticles of specific size can be transferred on specific areas Catalyst nanoparticles of specific size can be transferred on specific areas of a substrate from solution. One way to do this is by the use of polydimethyl siloxane (PDMS) stamps as described by Kumar et al., U.S. Pat. No. 5,512,131, where a patterned PDMS stamp is coated with a self assembled monolayer (SAM) forming molecular agent, the stamp is pressed against a substrate to which the SAM can bind and removed leaving behind a patterned surface coated with the SAM only on the areas corresponding to the high regions of the patterned stamp. In our present invention the SAM forming molecular agent will be replaced by a solution of catalyst particles having SAM-functionalized surfaces.

A PDMS stamp mirroring the catalyst nanoparticle coverage pattern desired to be generated on the substrate is dipped in a solution containing the catalyst nanoparticles (whose surfaces are functionalized with an appropriate SAM in a preferred embodiment) and then pressed on the desired substrate. PDMS stamps with complementary patterns and "inked" with catalyst nanoparticle solutions containing catalyst nanoparticles with different diameters can be used subsequently to generate patterns comprising different catalyst nanoparticle diameters at areas of the chip that require different cooling rates. In this way variable CNT bundle fill factors can be achieved at different areas of the chip, thus ensuring different cooling rates are achieved. Alternatively, more elaborate process schemes involving several steps of standard lithography can be used to create the patterns described above, however the coarseness of the patterns corresponding to different cooling requirements makes the simpler, cheaper and quicker PDMS stamp patterning more appropriate for the purposes of this invention.

Figure 9:
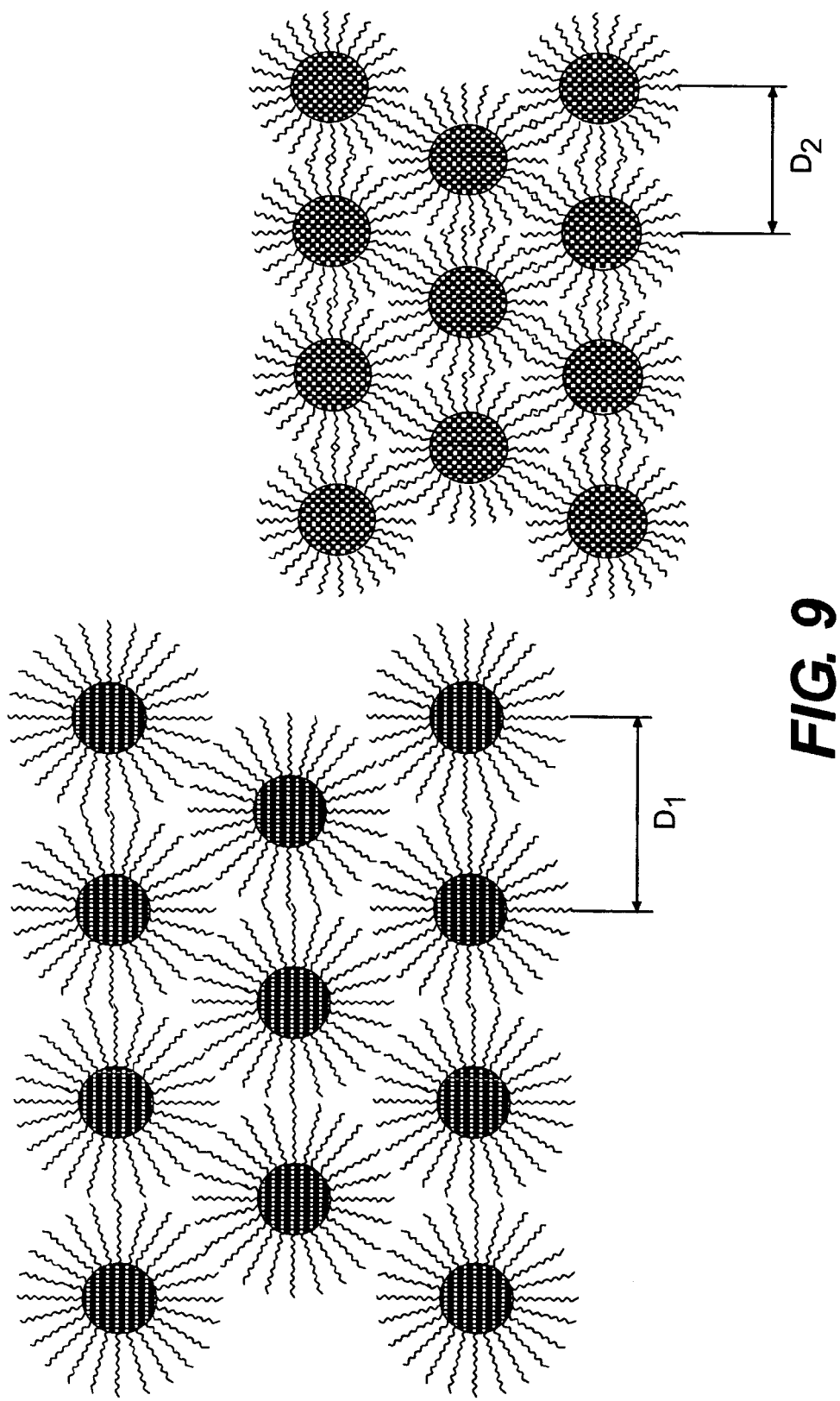
FIG. 9 illustrates one aspect of the invention comprising a method of placing CNTs on a surface to manufacture the semiconductor device of the invention wherein the distance between NNN (the next nearest neighbor) catalyst particles used for growing CNTs is varied to obtain different fill factors for the CNT bundles. Controlling the distance between NNN catalyst nanoparticles, controls the density of CNTs of the same size.

We also achieve varying the fill factor for the CNT bundle by controlling the distance between the next nearest neighbor (NNN) catalyst nanoparticles. (thus the density of CNTs of the same size). One way we do this is by adding self-assembled monolayer (SAM) caps on the catalyst nanoparticles where the SAM molecules have different alkyl chain lengths. This provides control of the NNN catalyst nanoparticle distance. these SAM caps are burned off before CNT growth. FIG. 9 illustrates this method of varying the distance between NNN catalyst particles. On the left diagram of FIG. 9, a SAM consisting of molecules with alkyl chain length equal to 14 repeat units (this number is chosen just for illustration purposes) is used as a cap for the catalyst particles; on the right diagram of FIG. 9, a SAM consisting of molecules with alkyl chain length equal to 8 repeat units is used as a cap for the catalyst particles. The catalyst particle sizes are identical before coating with the SAMs. After a closed packed configuration is formed (usually an energetically favorable state), the distances between the centers of the catalyst particles in the left and right diagram in FIG. 9 are $d_1$ and $d_2$ respectively. Distance $d_1$ is larger than $d_2$.

Figure 10A:
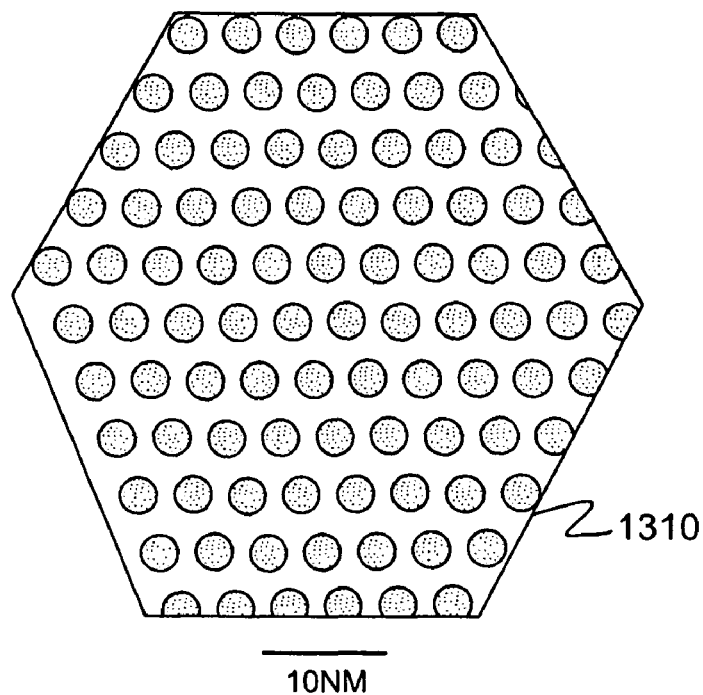
FIGS. 10A and 10B comprises TEM images of compressed films consisting of Ag particles that illustrate the results of a related art method for controlling the interparticle distance in closed packed films of capped Ag nanoparticle catalysts for producing CNTs when using SAMs consisting of molecules with different alkyl chain lengths to cap the nanoparticles.
Figure 10B:
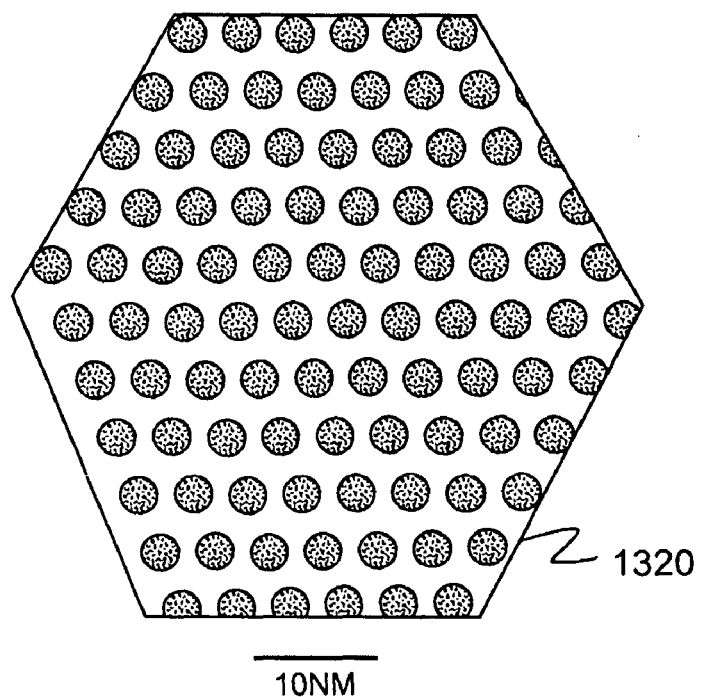

C. P. Collier et al., *Science*, 277, 1978, (1997) have shown the effectiveness of this method in controlling the interparticle distance in closed packed films of capped Ag nanoparticles when using SAMs consisting of molecules with different alkyl chain lengths to cap the nanoparticles. FIGS. 10A and 10B illustrate this, showing by way of elements 1310 and 1320 TEM images of compressed films consisting of Ag particles, 27 Angstroms in diameter, cropped so that each frame contains 102 particles. The illustration, 1310 comprises a video capture image (exposure 0.033s) of hexanethiol-capped particles separated by about 6 Angstroms. The illustration 1320 comprises a film image of decanethiol-capped particles separated by about 12 Angstroms. By controlling the distance between catalyst nanoparticles, the distance between NNN CNTs can be controlled.

Alternatively, the use of initially continuous catalyst layers can provide variable interparticle distances after melting the thin catalyst layer. This is a method of creating catalyst particles that is quite common in the art. By varying the thickness of the latter layer, the size and separation of catalyst particles can be varied in quite a consistent way on average, and thus the fill factor of the resulting CNT bundle can be controlled, thus providing control over the heat conductivity of the CNT bundle.

Using these art-known processes we can produce bundle densities on the surface of the device ("surface densities") that vary on average anywhere from about 1 nanotube per 1 $nm^2$ to about 1 nanotube per 100 $nm^2$.

At the end of the processing steps, including the deposition of a thick Cu or other metal film over the whole die area (over both, areas covered with CNT bundles of various CNT diameters or ones having CNT NNN at varying distance from each other, and uncovered areas), we employ a CMP step to planarize the Cu surface for obtaining flat surfaces. This facilitates attachment of the chip to the cooling structure. Again, heat conductivity, also known as thermal conductivity, is proportional to the fill factor and can be varied in several ways as described above.

Figure 3:
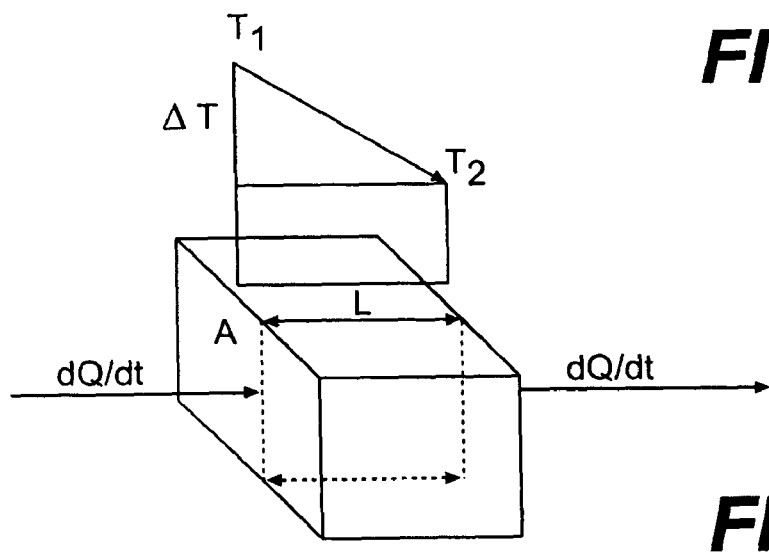
FIG. 3 comprises a three-dimensional graph illustrating the mathematical relationships in a material such as a silicon die or VLSI chip relative to its ability to conduct heat and is used to illustrate the mathematical computation of the thermal properties of the device.

Thermal conductivity, k, is the property of a material that indicates its ability to conduct heat. With reference to FIG. 3, k is defined as the quantity of heat, Q, transmitted in time t through a thickness L, in a direction normal to a surface of area A, due to a temperature difference $\Delta T$, under steady state conditions and when the heat transfer is dependent only on the temperature gradient. thermal conductivity=heat flow rate× distance/(area×temperature difference)

$$k = \frac{\left(\frac{dQ}{dt}\right) \cdot L}{A \cdot \Delta T}$$

measured in watts per kelvin-meter ($W \cdot K^{-1} \cdot m^{-1}$). The reciprocal of thermal conductivity, k, is thermal resistivity, r, measured in kelvin meters per watt (K m . . . $W^{-1}$).

$$r = \frac{1}{k} = \frac{A \cdot \Delta T}{\left(\frac{dQ}{dt}\right) \cdot L}$$

When dealing with a known amount of material, its thermal conductance, U, and the reciprocal property, thermal resistance, R, can be described. For general scientific use, thermal conductance is the quantity of heat that passes in unit time through a plate of particular area and thickness when its opposite faces differ in temperature by one degree. For a plate of thermal conductivity k, area A and thickness L this is U=kA/L, measured in $W \cdot K^{-1}$. This is an analogue to the relationship between electrical conductivity ($A \cdot m^{-1} \cdot V^{-1}$) and electrical conductance ($A \cdot V^{-1}$). Subsequently, R=L/kA.

There is also a measure known as heat transfer coefficient the quantity of heat that passes in unit time through unit area of a plate of particular thickness when its opposite faces differ in temperature by one degree. The reciprocal is thermal insulance. In summary:

thermal conductance U=kA/L, measured in $W \cdot K^{-1}$
thermal resistance R=1/U=L/kA, measured in $K \cdot W^{-1}$
heat transfer coefficient U/A=k/L, measured in $W \cdot K^{-} \cdot m^{-2}$
thermal insurance A/U=L/k, measured in $K \cdot m^2 \cdot W^{-1}$.

The total thermal resistance of several conducting layers that lie between the hot and cool regions is the sum of the thermal resistances of the individual layers, because A and Q are the same for all layers. In such a multilayer partition, the total resistance is given by:

$$R_{Total} = R_1 + R_2 + R_3 +$$

where $R_n$, n=1, 2, 3, ... is the thermal resistance of layer 1, 2, 3, ....
Thus, the total conductance is related to the conductance of the individual layers by:

$$\frac{1}{U_{Total}} = \frac{1}{U_1} + \frac{1}{U_2} + \frac{1}{U_3} + \ldots$$

where $U_n$, n=1, 2, 3, ... is the thermal conductance of layer 1, 2, 3, ....

In the example depicted in FIG. 4, a device 4000 comprising a Si wafer 4004 with thickness $d_1$ is backed in some parts of its surface by a Cu layer 4005 of thickness $d_2$ and some other areas by CNT bundles of the same thickness (not shown). FIG. 4 also illustrates a BGA (Ball Grid Array) 4001 interconnect area 4002, device member or level 4003 all as part of the structure of device 4000. Adhesion and catalyst layers are omitted from this calculation due to their relatively very small thickness and thus very small thermal resistance. Si has a thermal conductivity at room temperature of 144 $W \cdot K^{-1} \cdot m^{-1}$, [Microelectronics Packaging Handbook, edited by R. R. Tummala, E. J. Rymaszewski, A. G. Klopfenstein, Chapman and Hall New York, N.Y. (1997), part I, p. 323] Cu 398 $W \cdot K^{-1} \cdot m^{-1}$, [ibid] and CNT's have the highest thermal conductivity of any known material with k=6000 $W \cdot K^1 \, m^{-1}$ (Berber, S., Kwon, Y.-K., and Tomanek, D, supra; Srivastava, N. and Banerjee, K, supra.).

The total thermal insulance $A/U_{Total}$ from point A to point B in FIG. 4, i.e. the total thermal insulance of layer 4004 (Si, also referred to as layer 1 in the following calculations) and layer 4005 (Cu also referred to as layer 2 in the following calculations) is:

$$\frac{A}{U_{Total}} = \frac{A}{U_1} + \frac{A}{U_2} \Rightarrow \frac{d_1 + d_2}{k_{Total}} = \frac{d_1}{k_{Si}} + \frac{d_2}{k_{Cu}}$$

For our method to be effective we do not want the Si conductivity to be the controlling parameter that will determine the total thermal instance of the stack. The point where the thermal insulances of the layers 1 and 2 (Si and Cu, respectively) are equal is when $$\frac{d_1}{k_{Si}} = \frac{d_2}{k_{Cu}} \Rightarrow d_1 \cdot k_{Cu} = d_2 \cdot k_{Si} \Rightarrow d_2$$

$$= \frac{k_{Cu}}{k_{Si}} d_1 = \frac{398}{144} d_1 \Rightarrow d_2 = 2.764 d_1$$

In order for Cu to control the total insulance of the stack, the thickness of Cu $d_2$ should be at least 6-8 times that of Si. Thus the Si wafer should be thinned down (e.g. by chemical mechanical polishing) as much as possible without creating the potential for harming the chip structures on it and without endangering its structural stability to reduce $d_1$ and a Cu layer 2-3 times $d_1$ should be deposited on the back of the Si wafer.

Let us assume that $d_1$=50 μm and $d_2$=300 μm. Then the thermal insulance of the Si layer would be (50E–6 m)/(144 $W \cdot K^{-1} \cdot m^{-1}$)=3.47E–7 $W^{-1} \, K \cdot m^2$, and the thermal insulance of the Cu layer would be (300E–6 m)/(398 $W \cdot K^{-1} \cdot m^{-1}$)= 7.538E–7 $W^{-1} \, K \cdot m^2$, which is more than double the thermal insulance of the Si layer. In such case the total thermal insurance of the stack is 1.1E–6 $W^{-1} \, K \cdot m^2$, and 75% of that is due to Cu. Thus the Cu layer dominates the cooling process of the chip.

Figure 5:
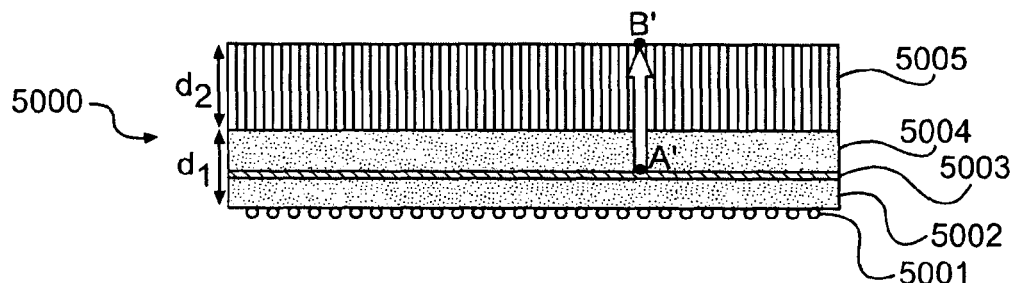
FIG. 5 comprises a side elevation in cross section of a semiconductor device and shows carbon nanotube bundles arrayed in a predetermined pattern, imposed by a catalyst layer pattern. We also use this figure in the mathematical computation of the thermal properties of the device.

In further developing this analysis, we refer to FIGS. 5 and 6. FIG. 5 illustrates a device 5000 comprising BGA 5001, interconnect area 5002, device level 5003, Si wafer 5004 and CNT (Carbon nanotube) bundle 5005, whereas FIG. 6 illustrates a device 6000 comprising BGA 6001, interconnect area 6002, device level 6003, Si wafer 6004, Cu layers 6005, and CNT bundle 6006. Now, if we apply CNT bundles according to this disclosure over the hot spots with thickness same as the Cu thickness in cooler areas ($d_2$=300 μm in our example) (FIG. 6), the thermal insurance of the stack in the CNT covered areas (FIG. 5 from A' to B') will be 3.47E–7 $W^{-1} \cdot K \cdot m^2$+ (300E–6 m)/(6000 $W \cdot K^{-1} \cdot m^{-1}$)=3.47E–7 $W^{-1} \cdot K \cdot m^2$+5E–8 $W^{-1} \cdot K \cdot m^2$=3.97E–7 $W^{-1} \cdot K \cdot m^2$, which is basically the thermal insulance of Si.

Obviously, the thinner we can make the Si layer the more effective the elimination of hot spots will be using the disclosed methods. Furthermore, the thinner we can make the Si layer, the more effective the total cooling rate of the whole chip will be and the lower the average chip temperature.

General Process Methodology

1. Identify hot-spot areas through thermal analysis of the on-die circuits.
   1a. Map the contour and temperature profile of the hotspot.
2. Fabricate a lithographic mask corresponding to the hotspot pattern; ensure that cooler regions within the hotspot are properly mapped.
3. Deposit a Cr or Ta or Ti adhesion layer for the subsequent catalyst layer, depending on the catalyst used. The adhesion layer secures the catalyst used for growing the nanotubes to the surface of the die, and as a result secures the nanotubes as well to the surface of the die. This adhesion layer also helps to join the matrix material to the die. The adhesion layer may also comprise a boron containing material or silicon containing material or metal containing material, the boron material and the silicon material comprising elemental boron and silicon or compounds of boron and silicon respectively, whereas the metal material comprises both elemental metals as well as metal compounds and alloys and combinations of a boron material or silicon material or metal material. Fan, S. S. et al., "Self Oriented Regular Arrays of Carbon Nanotubes and Their Field Emission Properties," *Science, Vol.* 283, pp. 512-14, (1999), however, describe growing these nanotubes directly on a silicon surface without employing an adhesion layer, this process also falling within the scope of one aspect of the invention.

4. Deposit a nickel or cobalt or Fe or other catalyst layer for nanotube growth.
5. Using the lithographic mask of step 2, pattern catalyst layer with standard lithographic techniques.
6. Insert the substrate in a CNT growth chamber and grow CNTs on the catalyst patterns using growth conditions that promote growth of vertically aligned CNTs (by vertically we mean perpendicular to the substrate). The catalyst layers break up into nanoparticles due to the substrate temperatures used before and during CNT growth.
7. Deposit a thick layer of copper over the entire structure by means of electrodeposition or other method.
8. CMP (chemical mechanical polish) copper just above the CNT bundle ends (see FIG. 6).

Based on FIG. 6, the heat conductivity over the hot spot which is covered with Catalyst/CNT layer is at least 10 times higher than the areas with lower cooling requirements that are covered with Cu. Now the structure is ready for application of a standard cooling technique, e.g., fluid cooling including water or water vapor cooling, air cooling, organic fluid cooling, including azeotropes thereof; halogenated refrigerant fluid cooling including azeotropic mixtures of halogenated refrigerants known in the art; substantially inert gas cooling such as nitrogen gas cooling; rare gas cooling, and the like; either as a once through cooling fluid process or a recirculated cooling fluid process. Mixtures of the cooling fluids can also be used, where each component of the mixture, when mixtures are used is from about 1 to about 99% on a weight basis. Other cooling processes may be used as noted FIG. 2 comprises an illustration of a lithographic mask with the black area 2001 corresponding to the cooler areas on the chip die of FIG. 1, and areas 2002, 2003, and 2004 comprise areas of increasing heat generation with increasing cooling needs. According to the present invention, deposition of CNT bundles with the long axis substantially perpendicular to the substrate and with varying fill factors (see above how this variation is achieved) needs to take place with the highest fill factor being at area 2004 (hot spot), a lower fill factor at area 2003, and an even lower fill factor at area 2002. The more CNT array or bundle variations the better the matching of the temperature gradients by the cooling capacities of the various CNT bundle or array areas. Each area illustrated in FIG. 2 corresponds to a lithographic mask or a PDMS stamp for imprint lithography. Each mask or stamp is used to pattern the catalyst layer (catalyst nanoparticles) on which vertically aligned CNT bundles can then be grown.

Figure 7:
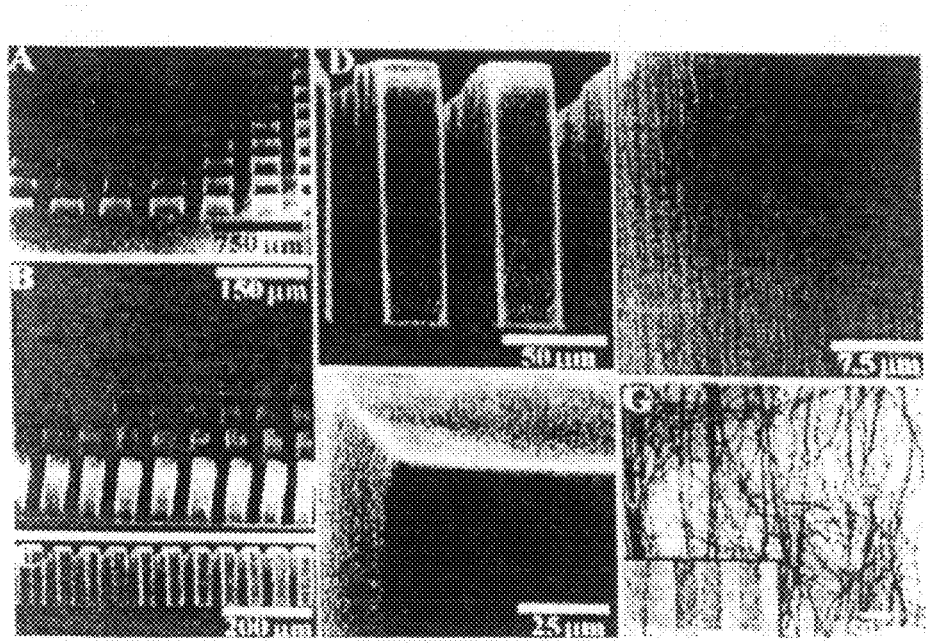
FIG. 7 comprises electron micrographs of self oriented nanotubes synthesized on n$^+$-type porous silicon substrates. It shows carbon nanotube bundles arrayed in a predetermined pattern, imposed by the catalyst layer pattern. The CNTs are oriented perpendicular to the substrate (figure taken from Fan, S. S. et al., supra).

FIG. 7 comprises electron micrographs of self oriented nanotubes synthesized on $n^+$-type porous silicon substrates (figure taken from Fan, S. S. et al., supra). Frame (A) comprises a SEM (scanning electron microscope) image of nanotube blocks synthesized on 250 µm by 250 µm catalysts patterns. The nanotubes are 80 µm long and oriented perpendicular to the substrate (Cf. frame (F)). Frame (B) comprises a SEM image of nanotube towers synthesized on 38 µm by 38 µm catalysts patterns. The nanotubes are 130 µm long. Frame (C) comprises a side view of the nanotube towers shown in Frame (B). The nanotubes are self assembled such that the edges of the towers are perfectly perpendicular to the substrate. Frame (D) comprises an SEM image of nanotube "twin-towers," a zoom-in view of the configuration illustrated in frame (C). Frame (E) comprises a SEM image of the sharp edges and corners of the top of a nanotube tower. Frame (F) comprises an SEM image showing nanotubes in a block are well aligned to the direction perpendicular to the substrate surface. Frame (G) comprises a TEM (transmission electron microscopy) image of pure multiwall nanotubes in several nanotube blocks grown on a $n^+$-type porous silicon substrate. Even after ultrasonification for 15 min. in 1,2-dichloroethane the aligned and bundled configuration of the nanotubes is still evident. The insert in Frame (G) is a high resolution TEM image that shows two nanotubes bundling together. The well ordered graphitic lattice fringes of both nanotubes are resolved.

Throughout this specification, we have set out equivalents, such as equivalent elements, materials, compounds, compositions, conditions, processes, structures and the like, and even though set out individually, also include combinations of these equivalents such as the two component, three component, or four component combinations. In all instances, combinations of equivalents and/or other materials set out in groups and combinations of processing treatments includes without limitation the combination of various items or elements set out in each group as well as the combination of elements of one group with the elements of all or any one of the other groups.

Additionally, the various numerical ranges describing the invention as set forth throughout the specification also include any combination of the lower ends of the ranges with the higher ends of the ranges, and any single numerical value within a range, or any single numerical value within a range that will reduce the scope of the lower limits of the range or the scope of the higher limits of the range, or both the lower ends and the higher ends of the ranges, and ranges falling within any of these ranges. The term "at least one" means more than one, or a plurality, or a significant number, or from 1 to about 1000, or from 1 to about 500, or from 1 to about 100.

The terms "about," or "substantial," or "substantially" as presently or subsequently applied to any parameters herein, such as a numerical value, including values used to describe numerical ranges, means slight variations in the parameter, or that which is largely or for the most part entirely specified. We also employ the terms "about," "substantial," and "substantially," in the same way as a person with ordinary skill in the art would understand them or employ them. In another embodiment, the terms "about," "substantial," or "substantially," when employed to define numerical parameters include, e.g., a variation up to five per-cent, up to ten per-cent, or up to 15 per-cent, or somewhat higher or lower than the upper limit of five per-cent, ten per-cent, or 15 per-cent. The term "up to" that defines numerical parameters is intended to include a lower limit of zero or a miniscule number, e.g. 0.001.

All scientific journal articles and other articles as well as patents and patent applications that this written description mentions including the references additionally cited in such scientific journal articles and other articles, and such patents and patent applications, are incorporated herein by reference in their entirety for the purpose cited in this written description, and for all other disclosures contained in such scientific journal articles and other articles as well as patents and patent applications as all or any one or any combination may bear on or apply not only to this written description but also to this specification as a whole.

Although we have described our invention by reference to some embodiments, we do not intend that such embodiments should limit our invention, but that other embodiments encompassed by the doctrine of equivalents are intended to be included as falling within the broad scope and spirit of the foregoing written description, the Abstract of the Invention, the drawing, and the claims.

We claim:

1. A semiconductive device comprising a die wherein the die comprises:
    (a) at least one defined hot-spot area lying in a plane on the die;
    (b) at least one defined minimum temperature area comprising an area lying in the plane on said die and at a temperature lower than the temperature of said hot-spot area, wherein said minimum temperature area comprises the minimum temperature of said die;
    (c) at least one defined intermediate temperature area comprising an area lying in the plane on said die at a temperature intermediate the temperature of said hot-spot area and said minimum temperature area;
    (d) cooling means comprising at least one bundle of first nanotube means composed of a heat conducting material and extending in a direction outwardly from the plane of said hot-spot area, said first nanotube means being operatively associated with and in heat conducting relationship with said hot-spot area and having heat conductivity sufficient to decrease any temperature gradient between said hot-spot area and any other temperature areas on the die;
    (e) cooling means comprising at least one bundle of additional nanotube means composed of a heat conducting material and extending in a direction outwardly from the plane of said intermediate temperature area, said additional nanotube means being operatively associated with and in heat conducting relationship with said intermediate temperature area and having heat conductivity sufficient to decrease any temperature gradient between said the intermediate temperature area and any other temperature areas on the die;
    (f) the heat conductivity of said bundle of first nanotube means being greater than the heat conductivity of said additional nanotube means;
    (g) said bundle of first nanotube means and said bundle of additional nanotube means being substantially surrounded by a matrix material comprised of a heat conducting material operatively associated with and in heat conducting relation with said minimum temperature area;
    (h) the heat conductivity of said bundle of first nanotube means and said bundle of additional nanotube means being greater than the heat conductivity of said matrix material;
    (i) the distal ends of said bundle of first nanotube means and said bundle of additional nanotube means being positioned for direct contact with a medium comprising a heat exchange medium.

2. The device of claim 1 comprising said bundle of first nanotube means, said bundle of additional nanotube means and said matrix material wherein said bundle of first nanotube means are substantially parallel to one another; and said bundle of additional nanotube means are substantially parallel to one another; and said bundle of first nanotube means and said bundle of additional nanotube means substantially:
    (a) are linear or helical;
    (b) are perpendicular to the plane of said hot spot;
    (c) comprise single wall or multi-wall nanotubes.

3. The device of claim 2 wherein said bundle of first nanotube means and said bundle of additional nanotube means have different arial densities on said device wherein said nanotube means having the higher arial density on said device cools the device at a rate higher than said nanotube means with the lower arial density on said device.

4. The device of claim 2 wherein said nanotubes in the said bundle of first nanotube means and said nanotubes in the bundle of additional nanotube means have different diameters wherein the said nanotube means having smaller diameter nanotubes cools said device at a rate higher than said nanotube means with larger diameter nanotubes.

5. The device of claim 2 wherein said matrix material comprises a metal material and said nanotube means comprises carbon.

6. The device of claim 2 comprising a VLSI device.

* * * * *